United States Patent [19]
Ito et al.

[11] Patent Number: 5,473,120
[45] Date of Patent: Dec. 5, 1995

[54] MULTILAYER BOARD AND FABRICATION METHOD THEREOF

[75] Inventors: Jun-ichi Ito, Tokuyama; Toshitsugu Shimamoto, Fujisawa, both of Japan

[73] Assignee: Tokuyama Corporation, Yamaguchi, Japan

[21] Appl. No.: 377,054

[22] Filed: Jan. 23, 1995

Related U.S. Application Data

[63] Continuation-in-part of Ser. No. 51,298, Apr. 23, 1993, abandoned.

[30] Foreign Application Priority Data

Apr. 27, 1992 [JP] Japan .................................. 4-107984
Dec. 11, 1992 [JP] Japan .................................. 4-331360

[51] Int. Cl.$^6$ .................................................. H05K 1/11
[52] U.S. Cl. .......................... 174/264; 174/262; 174/261; 174/255
[58] Field of Search ................................... 174/250, 255, 174/261, 262, 264; 361/778, 792

[56] References Cited

U.S. PATENT DOCUMENTS

| | | | |
|---|---|---|---|
| 4,328,531 | 5/1982 | Nagashima et al. | 361/401 |
| 4,706,167 | 11/1987 | Sullivan | 361/406 |
| 5,196,251 | 3/1993 | Bakhru et al. | 428/76 |
| 5,288,952 | 2/1994 | Sato et al. | 174/262 |

FOREIGN PATENT DOCUMENTS 16482  2/1988  Japan.

OTHER PUBLICATIONS

*Printed Circuits Handbook*, 3rd ed., pp. 33.2–33.9 (1988).
Denshi Zairyo, pp. 103–108 (Apr., 1991) "Characteristics and Application of Surface Laminar Circuits (SLC)". Translation provided.

*Primary Examiner*—Laura Thomas
*Attorney, Agent, or Firm*—Wenderoth, Lind & Ponack

[57] ABSTRACT

A multilayer board includes: a smooth-surfaced double-sided board having: a base material provided with a hole penetrating therethrough, a first layer wiring pattern provided on both surfaces of the base material and having a surface, and a conductive material filled in the hole, the filler having ends being substantially flush with the surface of the first layer wiring pattern, thus forming a via hole portion having ends; an insulating layer provided on at least one surface of the base double-sided board, the insulating layer being formed with an opening having an inner wall; and a second layer wiring pattern comprising a plating layer provided on the double-sided board through the insulating layer; wherein at least a portion of one of the ends of the via hole portion is exposed in the opening, and wherein the inner wall of the opening and exposed portion of the end of the via hole portion is coated with a plating layer connecting to the plating layer of the second layer wiring pattern, thus establishing electrical connection between the second wiring pattern and the via hole portion.

8 Claims, 12 Drawing Sheets

(6)

(7)

MULTILAYER BOARD AND FABRICATION METHOD THEREOF

This application is a continuation-in-part application of Ser. No. 08/051,298 filed on Apr. 23, 1993, now abandoned.

The present invention relates to a multilayer board used as a printed wiring board which consists of a base material on which a plurality of circuit patterns are formed through an insulating layer, and a fabrication method thereof.

BACKGROUND OF THE INVENTION

In order to increase the circuit density of a board including a base material having formed thereon a wiring pattern, or make it multifunctional or small-sized, there have been developed and proposed various boards such as one having interstitial via holes, and one including a base material on which a plurality of wiring patterns are laminated through an insulating layer.

Typical examples of conventional multilayer boards include the following. The term "double-sided board" as used herein refers to a board which has provided thereon a wiring pattern on each side thereof.

(1) *Printed Circuits Handbook*, chapters 33.2–33.8 (3rd Ed.; 1988) describes a multilayer board as shown in FIG. 2 in which double-sided boards 105 and 105' each having a wiring pattern 104 on each side thereof and a via hole 103 formed by plating a through hole, are laminated through a prepreg consisting of an adhesive resin, with connection between the wiring patterns of the laminated double-sided board being established by forming a common via hole 102 penetrating all the layers.

(2) Denshi Zairyo (Apr., 1991) page 103–108 describes a multilayer board as shown in FIG. 3. That is, a first layer wiring pattern 108 is formed on a base material 106. A second wiring pattern 109 made of a plating layer is formed on the first wiring pattern 108 through an insulating layer 107, and a third wiring pattern 109' made of a plating layer is formed on the second wiring pattern 109 through an insulating layer 107'. In addition, a fourth or more wiring patterns are formed, and a through hole 102 penetrating all the layers is formed. Finally, an electric source layer 110 is connected as an outermost layer.

(3) Japanese Utility Model Application Laid-Open No. 16482/1988 describes a board as shown in FIG. 4. That is, a base material 106 has provided thereon a first layer wiring pattern 108 made of a plating layer, and wiring patterns 109 and 109' are serially formed on the first layer wiring pattern 108 through insulating layers 107 and 107', respectively. The insulating layers between the wiring patterns are provided with interstitial via holes 111 filled with a conductive paste so as to be flush with the insulating layer to thereby establish electrical connection between the wiring patterns.

Among the aforementioned, the multilayer board described in (1) above is a popular one which is now put into practical use. In such a multilayer board, a plurality of double-sided boards 105 and 105' separately fabricated are laminated through a prepreg 101, which requires a very high precision in the alignment between the boards. That is, it is necessary that the through hole 102 provided after a plurality of boards are laminated so as to penetrate all the layers should certainly penetrate at predetermined places in each wiring pattern. If such alignment of the laminate is missed, an immediate fault occurs. Therefore, it has been necessary to ensure a penetration portion rather with some allowance in each wiring pattern. This hinders increase in the circuit density. When electroconduction is obtained between the through hole 102 penetrating all the layers and intermediate wiring patterns by means of the through hole 102, the contact area between the two is small and a problem arises in the reliability of electrical connection. In addition, through holes are provided also in those wiring patterns which do not need electroconduction, which limits freedom in wiring. This also hinders increase in the circuit density.

Further, the aforementioned multilayer board is very complicated to manufacture since it not only requires at least two plating operations in the step of manufacturing a unit board but also requires steps of laminating a unit board, producing an opening through the board, plating, etc.

The multilayer board described in (2) above also has a through hole 102 penetrating all the layers, and like the multilayer board described in (1) above, hinders increase in the circuit density. Wiring pattern is laminated on one surface of the base material, and hence the degree of increase in the number of electrical connection terminals between the wiring patterns is greater than the increase in the number of pattern layers. This also hinders increase in the circuit density.

Further, in the manufacture of the aforementioned multilayer boards, formation of an insulating layer and plating must be performed once each in order to form a single layer of wiring pattern. After all the wiring patterns have been formed, production of openings through the board and plating must be performed, and this leaves room for further improvement in the manufacture.

The multilayer board described in (3) above connects a plurality of wiring patterns laminated through an insulating layer by means of an opening provided in the insulating layer and filled with a conductive paste. However, the opening differs from a hole in that the opening has a closed bottom and hence the conductive paste filled and cured therein tends to form a space between it and the surface of the wiring pattern which it originally contacted since it shrinks upon curing. There is room for improvement in reliability of electrical connection. Similarly to (2) above, wiring patterns are laminated on one side of the base material, and the degree of increase of the number of electrical connection terminals is greater than the increase in the number of wiring pattern layers, which hinders increase in the wiring density.

Further, in the fabrication of the aforementioned multilayer boards, curing of the conductive paste filled in the insulating layer and the opening must be performed for each layer. Therefore, the board is subjected to thermal hysteresis twice for each connection between the wiring patterns, which not only makes the production procedure complicated but also causes a problem of thermal deterioration of the board.

In the multilayer boards described in (2) and (3) above, electronic components are mounted on only one surface of the board, leading to decrease in the mounting density.

Therefore, an object of the present invention is to solve the aforementioned problems encountered in the conventional techniques, and to provide a multilayer board which has a high reliability of electrical connection between wiring patterns laminated thereon, enables increase in circuit density, and also increase in the density of mounting components thereon.

Another object of the present invention is to provide a method of fabricating the aforementioned multilayer board.

SUMMARY OF THE INVENTION

The present inventors have made extensive investigation in order to achieve the above-described objects, and as a result they have found that use of a double-sided board having a smoothed surface, fabricated by forming a first layer wiring pattern on both sides of a base material, and filling a conductive material in a hole penetrating through the base material to form a via hole portion, enables formation of an insulating layer on the double-sided board and of wiring patterns from a plating layer with a high precision. It has been found out that formation of a plating layer through an insulating layer on both sides of the double-sided board, and formation of a second layer wiring pattern from said plating layer, and, furthermore, achieving electrical connection between said second layer wiring pattern and the first layer wiring pattern, or between said second layer wiring pattern and the via hole portion, make it possible to form wiring patterns so as to electrically connect the wiring of each layer with each other without separately providing via hole portions penetrating all the layers as conventionally conducted, and thus make it possible to design wiring patterns with high degree of freedom and to increase circuit density, and that, in this case, coating said via hole portion and said terminal portion of the first layer wiring pattern which connects with the via hole portion with a plating layer gives a multilayer board with high reliability. Further, it has been found that lamination of wiring patterns on both surfaces of the double-sided board enables mounting of electronic components on both surfaces of the board. In the fabrication procedure, lamination of wiring patterns on both surfaces of the double-sided board enables formation of insulating layers, plating layers, and wiring patters from the plating layers to be performed simultaneously, which makes the fabrication procedure more efficient.

Thus, the present invention provides a multilayer board comprising: a smooth-surfaced double-sided board having: a base material provided with a hole penetrating therethrough, a first layer wiring pattern provided on both surfaces of the base material and having a surface, and a conductive material filled in the hole, the filler material having end surfaces being flush with the surface of the first layer wiring pattern, thus forming a via hole portion having end surfaces; an insulating layer provided on each surface of the base material, the insulating layer being formed with an opening having an inner wall; and a second layer wiring pattern comprising a plating layer provided on at least one surface of the double-sided board through the insulating layer; wherein at least a portion of one of the end surface of the via hole portion is exposed in the opening, and wherein the inner wall of the opening and exposed portion of the end of the via hole portion is continuously coated with a plating layer connecting to the plating layer of the second layer wiring pattern, thus establishing electrical connection between the second wiring pattern and the via hole portion. Said first layer wiring pattern has a connecting terminal which electrically connects with the via hole portion, and said via hole portion and said terminal portion of the first layer wiring pattern which connects with said via hole portion are coated with a continuous plating layer.

<To be deleted> (Method claims are to be deleted.)

Achievement of the aforementioned objects and other objects will become apparent by the following description.

DESCRIPTION OF PREFERRED EMBODIMENTS

Figure 1:
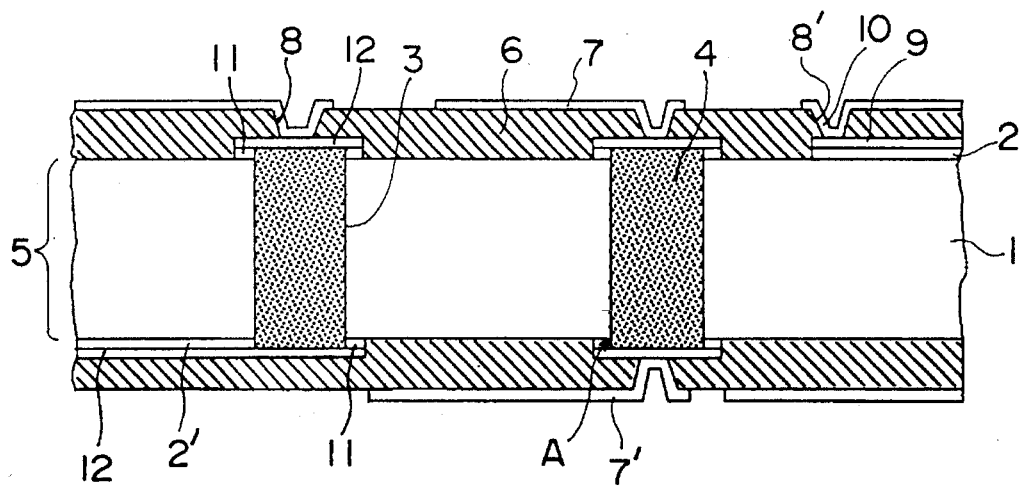
FIG. 1 is a cross sectional view showing an example of a multilayer board of this invention.
Figure 2:
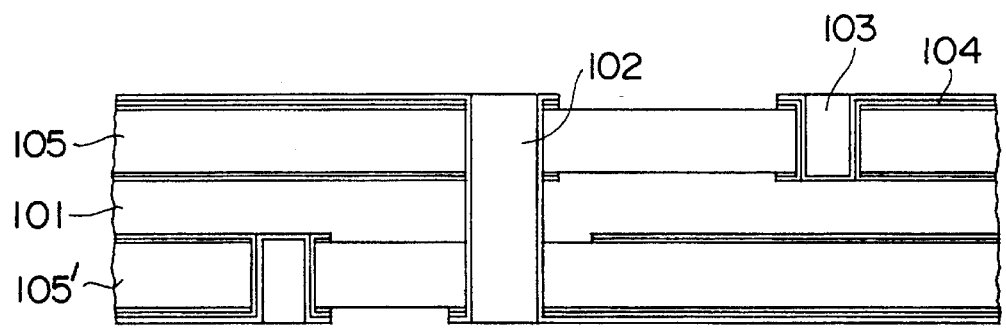
FIG. 2 is a cross sectional view showing an example of a conventional multilayer board.
Figure 3:
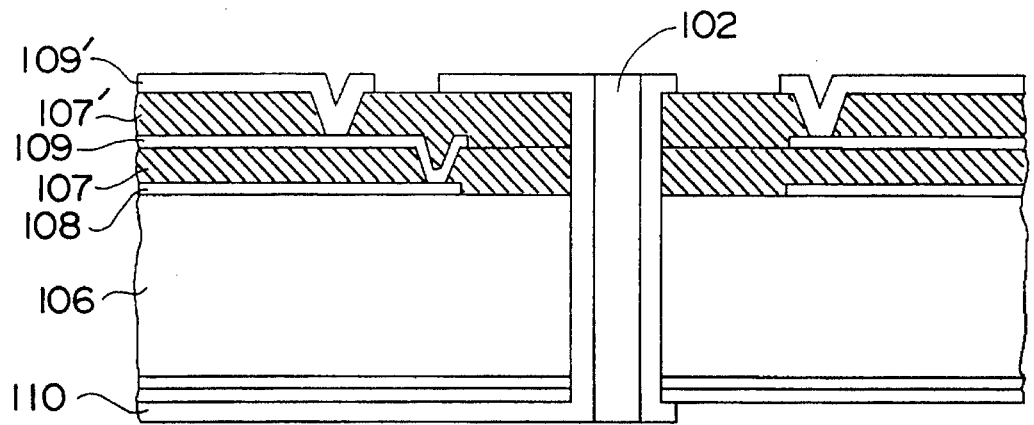
FIG. 3 is a cross sectional view showing another example of a conventional multilayer board.
Figure 4:
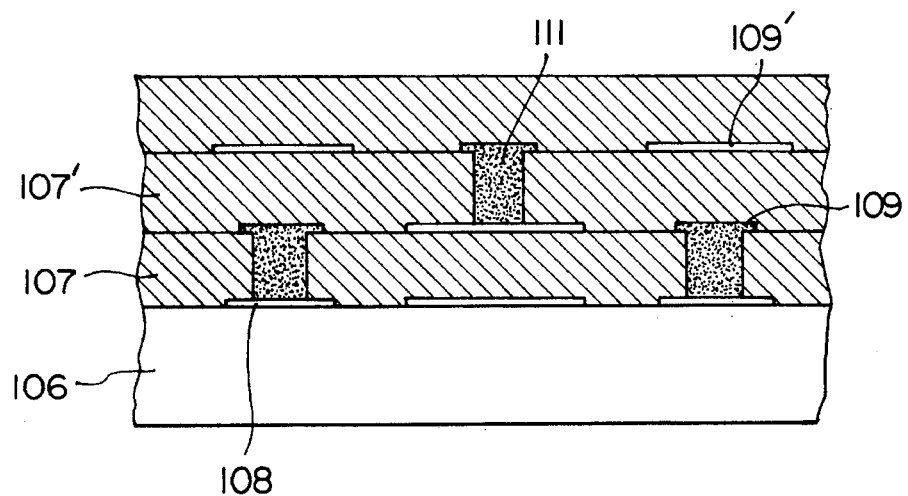
FIG. 4 is a cross sectional view showing still another example of a conventional multilayer board.
Figure 5:
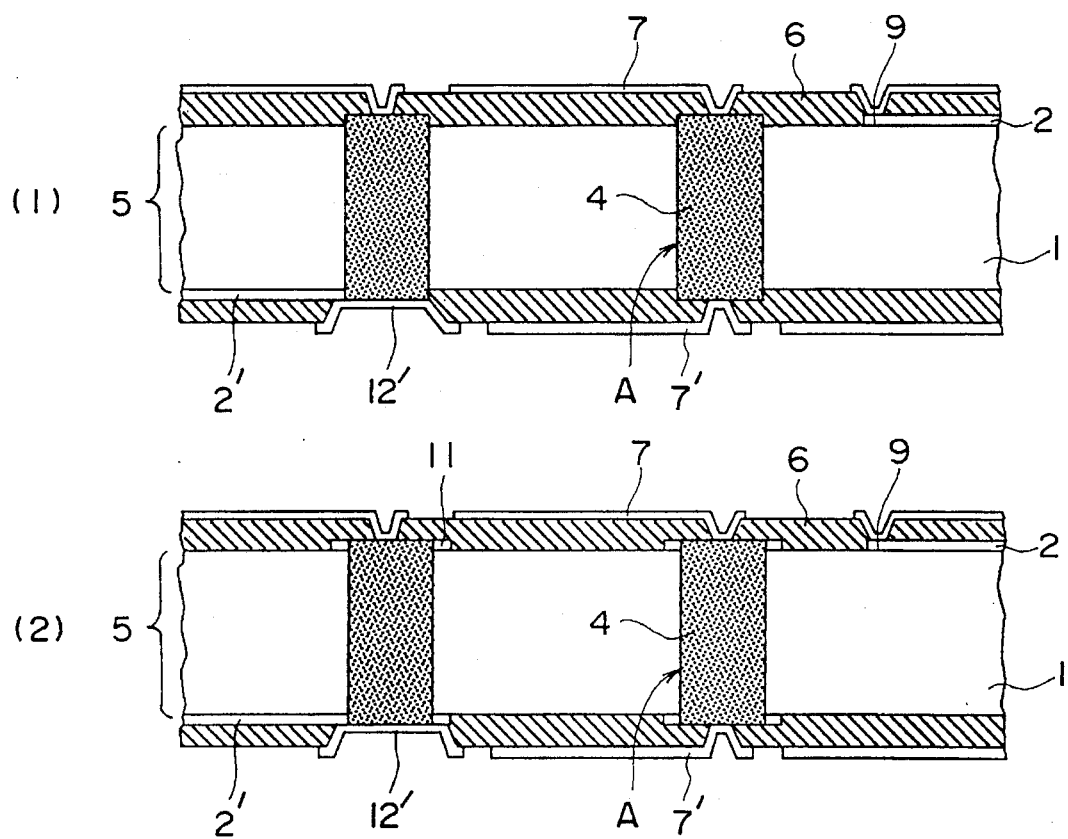
FIG. 5 is a cross sectional view showing another example of a multilayer board of this invention.

Representative embodiments of the multilayer board of this invention are shown in cross section in FIGS. 1 and 5.

As shown in FIGS. 1 and 5, the multilayer board of this invention includes a double-sided board 5 having a smooth surface, which has first layer wiring patterns 2,2' on a base material 1, and a via hole portion A. The via hole portion A is formed by filling a conductive material 4 in a hole 3 penetrating the base material, and processing so that the ends of the material are substantially flush with the surfaces of the first layer wiring patterns 2,2'. On both surfaces of the double-sided board 5 are formed second layer wiring patterns 7,7' made from a plating layer through an insulating layer 6. The insulating layer 6 is provided with an opening 8 so that a portion of the ends of the via hole portion A can be exposed therein. Also, the insulating layer 6 is provided with another opening 8' so that a portion of a terminal portion 9 of the first layer wiring patterns 2 can be exposed therein. A continuous plating layer is coated over the outer surface of the insulating layer 6, the inner walls of the openings 8,8', the exposed surface of the via hole portion, and the exposed surface of the terminal portion 9, and required places of the plating layer on the insulating layer 6 are etched to form the second layer wiring patterns 7,7'. The continuous plating layer electrically connects the second wiring patterns 7,7' to the via hole portion A, and the first layer wiring patterns to the second layer wiring patterns.

The electrical connection between the end portion of said via hole portion A and the terminal of said first layer wiring pattern which connects with said end portion is surely achieved by forming a continuous plating layer on the surfaces thereof.

For example, the mode shown in FIG. 1 exhibits a case where the above connected portion is coated with plating layer 12. The mode shown in FIG. 5(1) exhibits a case where the above connected portion is coated with plating layer 12', in place of said plating layer 12, which is connected to the second layer wiring pattern 7'. In this case, as shown in FIG. 5(2), the end portion of said first layer wiring pattern preferably takes a configuration wherein a land portion 11 is formed on the periphery of the end portion of said via hole portion A. Of course, such a configuration without a land portion as shown in (1) may be employed.

As the base material 1, any known ones made of a known material and having a known configuration may be used without restriction. Representative examples include synthetic resin laminate such as phenolic paper laminate, epoxy-paper laminate, polyester paper laminate, epoxy-glass laminate, PTFE resin-paper laminate, polyimide-glass laminate, BT (bismaleimide triazine)-glass laminate, and composite laminate; flexible board such as polyimide board or polyester board; metallic base material obtained by coating with an epoxy resin a perforated plate of metal such as aluminum, iron, or stainless steel, or ceramic board.

Material of the first layer wiring patterns 2,2' formed on both surfaces of the base material 1 is not limited particularly and any known conductive material may be used freely. Representative materials are, for example, copper, nickel, aluminum, etc. Among them, cooper is used most preferably. The thickness of the wiring patterns is not limited particularly. Generally, a thickness of 5 to 70 µm is suitable.

In the aforementioned double-sided board, the via hole portion A is formed by filling the material 4 having conductivity in the hole 3 provided through the base material in such a manner that the end surfaces of the filler material are smooth and substantially flush with both surfaces of the double-sided board. As such a material having a conductivity, any known material may be used without limitation. For example, it is typically a cured material derived from a curable conductive substance which gives rise to a cured material having conductivity. As the curable conductive substance, there can be used known curable conductive substances obtained by mixing a conductive material such as gold, silver, copper, nickel, lead, or carbon with a known crosslinking thermosetting resin, together with an organic solvent as necessary to form a paste.

In order to form a via hole portion having a good conductivity, it is preferred to select conductive material and adjust the amount of each component when the aforementioned curable conductive substance is prepared so that the electric resistance after curing can be $1\times10^{-2}$ $\Omega$cm or less.

Further, the diameter of the via hole portion is not limited particularly, and may be set freely. Generally, the diameter of the via hole portion may be one which enables filling of the aforementioned curable conductive substance, specifically, at least 0.2 mm, preferably within the range of 0.3 to 2 mm.

In order to establish reliability of electrical connection between the via hole portion and the first layer wiring pattern, it is necessary to achieve said electrical connection between said via hole portion A and the connecting terminal portion of said first layer wiring pattern which connects therewith by means of forming a continuous plating layer on the surface thereof.

In this case, as mentioned above, with a view to further increasing the electrical connection between said via hole portion A and the first layer wiring pattern 2,2' of said double-sided board, the reliability of electrical connection attained by coating with said plating layer can be further increased by giving the configuration of a land portion, which encircles said via hole portion, to the connecting terminal portion of said first layer wiring pattern which connects with said via hole portion.

In the present invention, on at least one surface of the aforementioned double-sided board 5 is formed at least one wiring pattern made of a plating layer formed on the board through the insulating layer 6.

As the insulating layer 6, there can be used any known material without limitation. For example, suitable ones are conventional curable insulating resins known as photosensitive insulating resist, for example PROBIMER 52 (trade name, produced by CIBA GEIGY), PROBICOTE 5000 (trade name, produced by NIPPON PAINT), etc. Any thickness of the insulating layer may be used so far as the insulation between the wiring patterns present on both surfaces thereof can be maintained, and generally a thickness of 20 to 100 µm is suitable.

The surface of the insulating layer is preferably roughened in order to increase adhesion of the plating layer formed on the surface thereof. Method of surface roughening is not limited particularly and there can be used any known methods such as physical scrubbing using buff, brush, etc., chemical roughening by immersing in an alkaline potassium permanganate solution, chromic acid solution, etc.

Any known material may be used without limitation for the plating layer constituting the wiring pattern. For example, there can be cited, copper, nickel, etc. Among them, copper is used most advantageously. Any thickness of the plating layer may be used so far as a thickness sufficient for exhibiting conductivity is ensured. Usually, the thickness is suitably 50 µm or less, preferably 5 to 35 µm.

In the present invention, in the insulating layer 6, there is provided an opening 8 for connecting the wiring pattern and the via hole portion. The opening is provided such that the terminal portion of the wiring pattern and at least a portion of the end surface of the via hole portion is exposed. In case the wiring patterns are connected to each other, the opening 8 is formed so that the terminal portion of the wiring pattern closer to the double-sided board is exposed. The area of the exposed portion may be such that electrical connection can be established by coating a plating layer 10 as described below. Generally, the area of the exposed portion exposed from the insulating layer may be an area having a corresponding diameter of 50 µm or more. Furthermore, the shape of the opening is not limited particularly, and any shape suitable for designing wiring patterns, such as circle, ellipse, rectangle, square, etc., may be adopted properly.

When neither said via hole portion A nor the connecting terminal portion of said first layer wiring pattern which connects therewith is coated with the plating layer shown in FIG. 1, a mode may be employed wherein the end portion of said via hole portion A and the connecting terminal portion of said first layer wiring pattern which connects with the end surface thereof are exposed by means of forming an opening in the above insulating layer and wherein, as shown in FIG. 5, the inner wall of said opening and the above exposed portion are coated with a plating layer which forms the second layer wiring pattern, so that the connection between said second layer wiring pattern and said via hole portion and the one between said via hole portion A and the terminal of said first layer wiring pattern which connects therewith may be respectively established more surely.

As other configuration of the multilayer board of this invention, any known multilayer board structure may be used without limitation. For example, though not shown in the drawings, it is preferred to provide a layer having a good resistance using a solder resist at required or desired places in the outermost layer.

Figure 12:
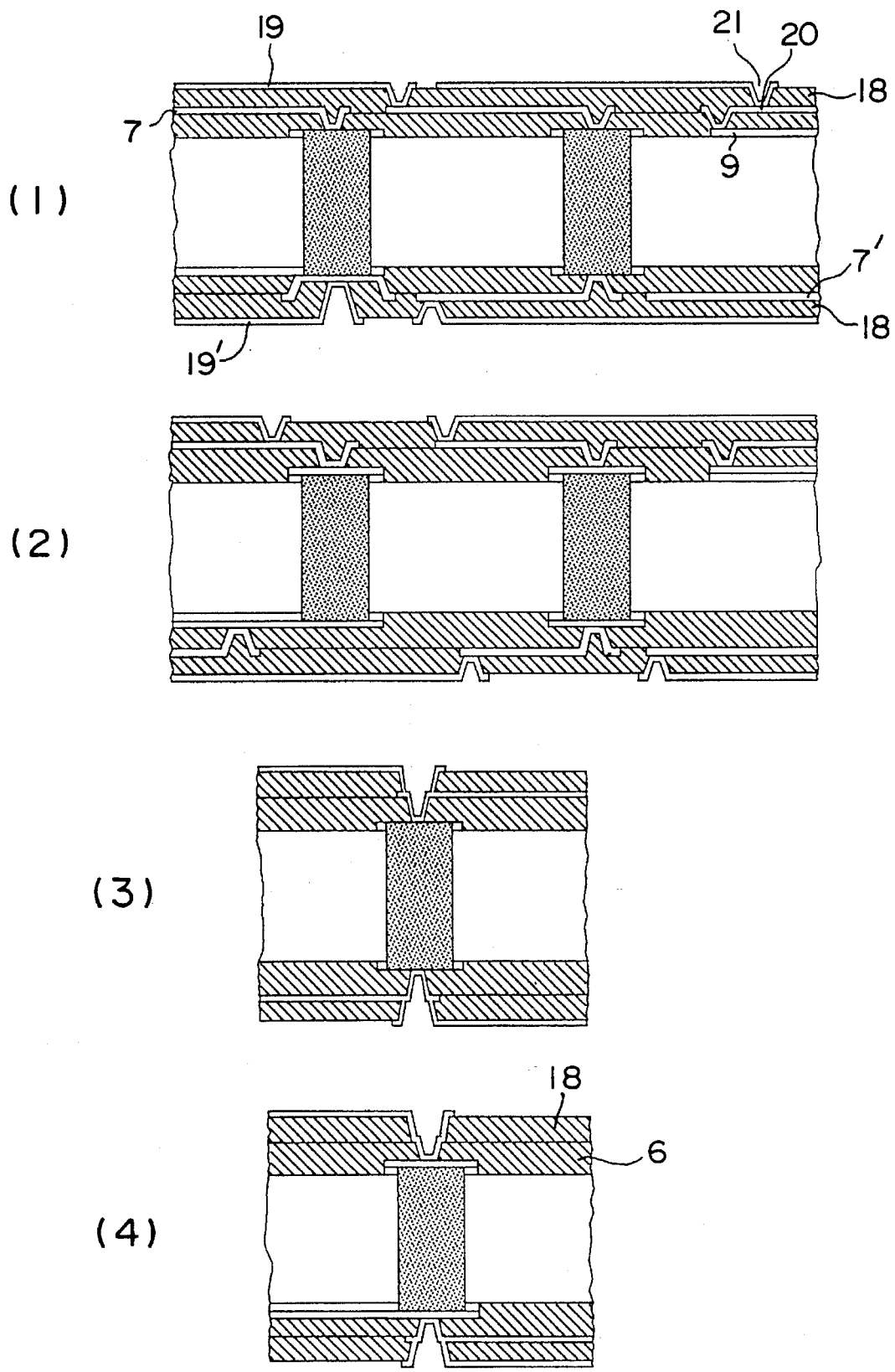
FIG. 12 is a cross sectional view showing an example of the multilayer board of this invention which has a three-layer wiring pattern.

The multilayer boards according to the embodiments shown in FIGS. 1 and 5 are examples of 4-layer board having formed one layer of wiring pattern, through an insulating layer, on the first layer wiring pattern present on the both surfaces of a double-sided board. However, the present invention is not limited thereto, and may be configured as one in which a further wiring board is laminated through an insulating layer on the second wiring pattern. Such an example is shown in FIG. 12 (1) to (4). That is, FIG. 12 shows some embodiments in which a third layer wiring patterns 19,19' made of a plating layer, are formed on the surfaces of the second layer wiring patterns 7',7 through an insulating layer 18. FIG. 12(1) shows an embodiment in which a third layer wiring pattern is formed on the second layer wiring pattern of the multilayer board according to the embodiment shown in FIG. 5. FIG. 12(2) shows an embodiment in which a third layer wiring pattern is formed on the second layer wiring pattern of the multilayer board according to the embodiment shown in FIG. 1. Further, FIGS. 12(3) and 12(4) show an embodiment in which in the position of the via hole portion the second layer wiring pattern and the third layer wiring pattern are connected to the via hole portion in order, or in which the third layer wiring pattern is directly connected to the via hole portion without intervention of the second layer wiring pattern.

In these embodiments, formation of the insulating layer 18 and the third layer wiring pattern, and electrical connection between the third layer wiring pattern and other layer or the via hole portion are performed in a manner similar to the method of forming the insulating layer 6 and the second layer wiring pattern.

For example, the formation of the third layer wiring pattern may be carried out by forming an insulating layer having an opening at predetermined places, forming a plating layer, and etching it off at predetermined places. The electrical connection between the third layer wiring pattern and the other wiring patterns or the via hole portion may be performed as follows. That is, the insulating layer 18 is provided with an opening 21 such that at least a portion of the terminal portion 9 of the first layer wiring pattern, the terminal portion 20 of the second layer wiring pattern or the end surface of the via hole portion can be exposed therein, and the inner wall of the opening and the exposed portion are coated with a plating layer which is continuous with the plating forming the third layer wiring pattern 19,19' to thereby connect the third layer wiring pattern to the second layer wiring pattern, the first layer wiring pattern or the via hole portion.

In the aforementioned connection, in case the third layer wiring pattern is directly connected to the first layer wiring pattern or the via hole portion, it is sufficient to provide an opening in the insulating layers 6 and 8 serially and then perform coating with the aforementioned plating layer, as shown in FIG. 12(4).

Figure 13:
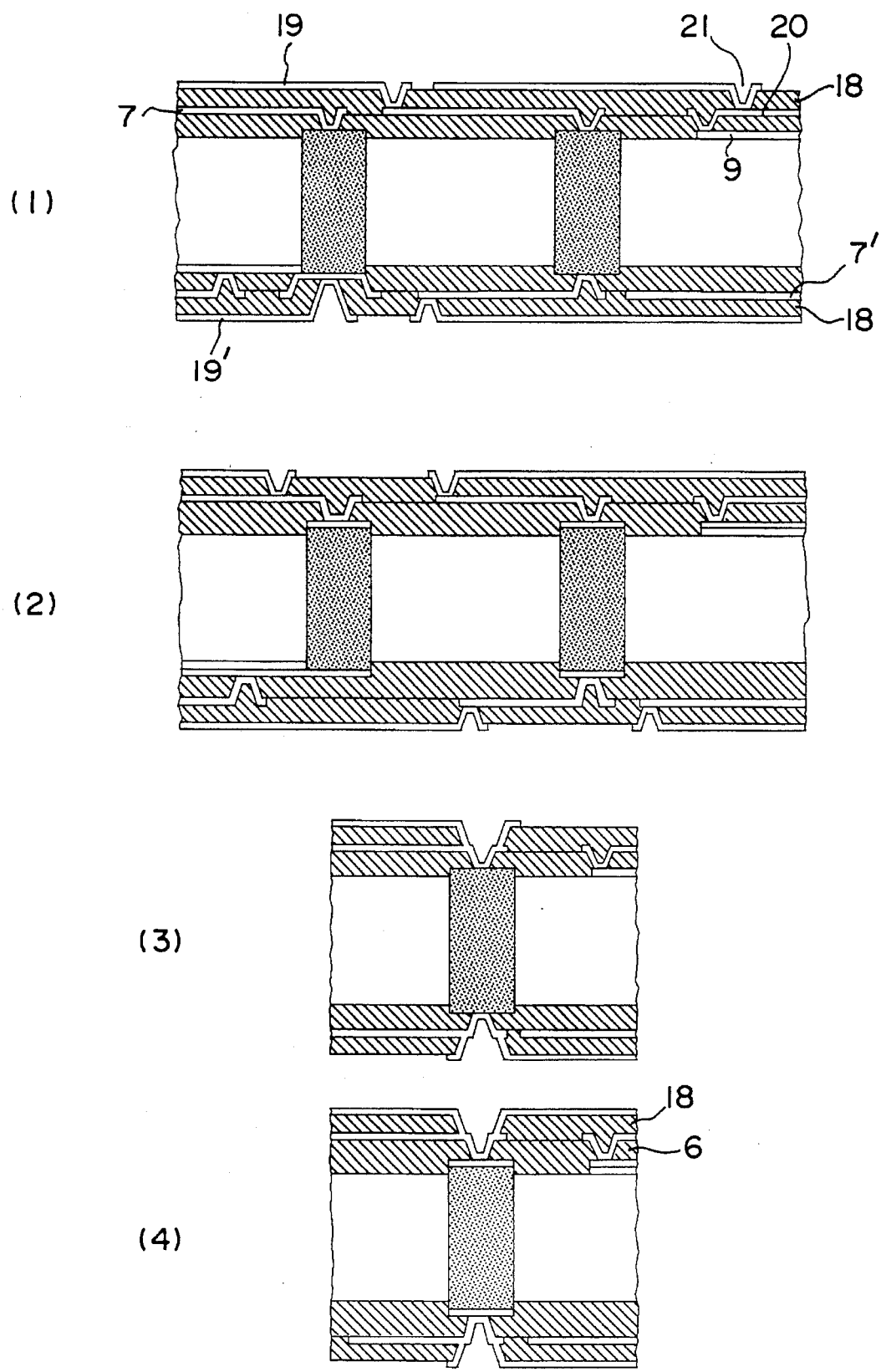
FIG. 13 is a cross sectional view showing another example of the multilayer board of this invention which has a three-layer wiring pattern.

FIG. 13 (1)–(4) show a mode of FIG. 12 (1)–(4) wherein no land portion is formed at the connecting terminal portion of said first layer wiring pattern.

Representative fabrication method of the multilayer board of this invention is exemplified as follows.

Figure 6:
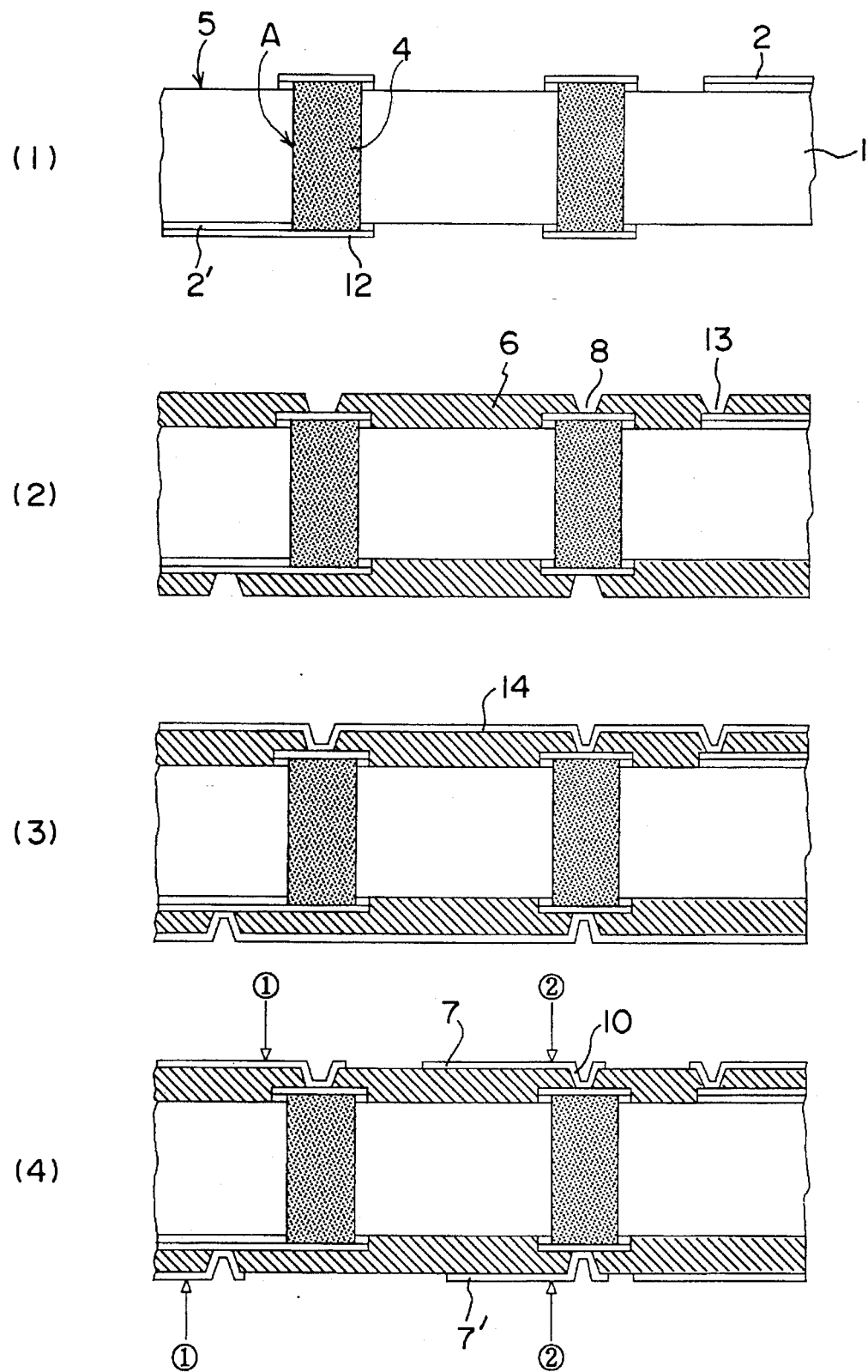
FIG. 6 is a series of cross sectional views showing an example of the fabrication procedure of a multilayer board of this invention.

That is, FIG. 6 is a cross sectional view showing a fabrication procedure for fabricating a multilayer board. As shown in FIG. 6, (1) on at least one surface of a smooth-surfaced double-sided board 5 having a base material 1 provided with a hole 3 penetrating therethrough, first layer wiring patterns 2,2' are provided on both surfaces of the base material, and a conductive filler material 4 is filled in the hole, thus forming a via hole portion A; (2) an insulating layer 6 is coated such that an opening 8 is formed in which a terminal portion 13 of the first layer wiring pattern and the via hole portion A which need be connected to a second layer wiring pattern formed on the first layer wiring pattern are exposed; (3) thereafter, the exposed portion, the inner wall of the opening 8, and the surface of the insulating layer are coated with a plating layer 14; (4) predetermined places of the plating layer are etched to form wiring patterns to thereby form second layer or more wiring patterns 7,7' and a plating layer 10 for conduction which is continuous with the wiring patterns.

The method of forming the insulating layer 6 is not limited particularly and any conventional method may be used freely. Generally, there can be used curable insulating resins of various forms which cure by light or heat, such as photosensitive dry film, liquid solder resist, combination of photosensitive dry film and liquid solder resist, etc. As the method of forming the insulating layer, printing method, photographic method, etc. may be selected properly depending on fineness using the aforementioned curable insulating resin. For example, liquid solder resist which cures upon irradiation of light, or curable insulating resin layer such as photosensitive dry film is laminated all over the surface of the double-sided board, and after irradiating light except where formation of an opening is needed, uncured portion is removed by development to form an insulating layer.

In the aforementioned method, use of photosensitive dry film which cures with light for forming an insulating layer results in high precision of thickness of the insulating resin layer and allows simultaneous formation on both surfaces, thus enabling formation of insulating layers efficiently and with high precision.

In the embodiment shown in FIG. 6, the dimension of the opening 8 in the insulating layer 6 is preferably within the aforementioned range which can establish electrical connection with a plating layer.

Figure 7:
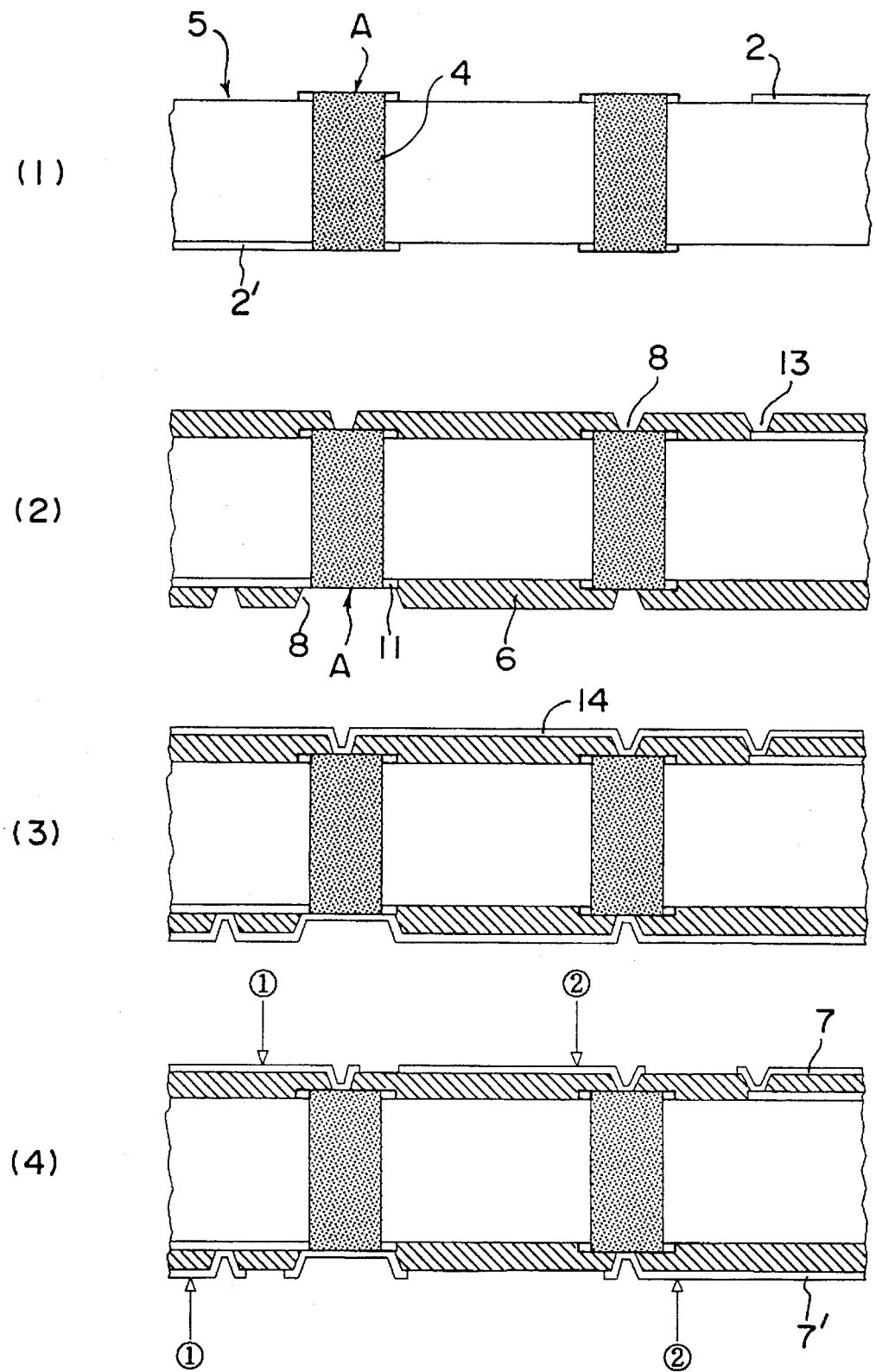
FIG. 7 is a series of cross sectional views showing another example of the fabrication procedure of a multilayer board of this invention.

FIG. 7 is a variation of the embodiment shown in FIG. 6, i.e., an embodiment in which a double-sided board is used of which the plating layer 12 is omitted. In this case, in order to ensure conduction to the via hole portion A which needs electrical connection to the first layer wiring pattern 2', the opening 8 provided in the insulating layer 6 is formed so that the total area of the end surface of the via hole portion A and the land portion 11 of the wiring pattern therearound are exposed. This configuration enables simultaneous plating of the exposed portions by subsequent formation of the plating layer 14, ensuring electrical connection of these portions.

By the procedure shown in FIG. 7, it is possible to omit one plating step from the procedure shown in FIG. 6.

In the aforementioned method, while the method of forming the plating layer 14 is not limited particularly, generally electroless plating of a metal is preferred.

Also, in order to form the wiring pattern from the plating layer, there can be used a similar method to the formation of the aforementioned first layer wiring pattern. Generally, etching methods are preferred.

In the present invention, similarly, an insulating layer and a wiring pattern can be laminated in order on the second layer wiring pattern.

The aforementioned laminated wiring pattern can be used in various applications without limitation, such as signal conductor, power line, ground plane, electromagnetic interference shielding layer, etc.

While FIG. 6 shows the embodiment in which end surfaces of the via hole portion A of the double-sided board are coated with the plating layer 12 in advance, such a plating layer is not indispensable.

In case the plating layer is absent, a plating layer may be provided so as to be continuous with the plating layer of the second layer wiring pattern when it is formed, as shown in FIG. 7. That is, FIG. 7 shows the embodiment in which the insulating layer is formed so that the end surfaces of the via hole portion A which needs to be connected to the first layer wiring pattern and the layer portion 11 formed therearound can be exposed, and the exposed portions can be simultaneously plated.

In the aforementioned fabrication method, specific method of fabricating the double-sided board is not limited particularly, and may be decided properly depending on the structure of the multilayer board. To exemplify such a fabrication method for the double-sided board, there can cited, for example, the fabrication method shown in FIG. 8 as a representative method for the double-sided board used in the fabrication procedure shown in FIG. 6, and the method shown in FIG. 9 as a representative method for the double-sided board used in the fabrication procedure shown in FIG. 7.

Figure 8:
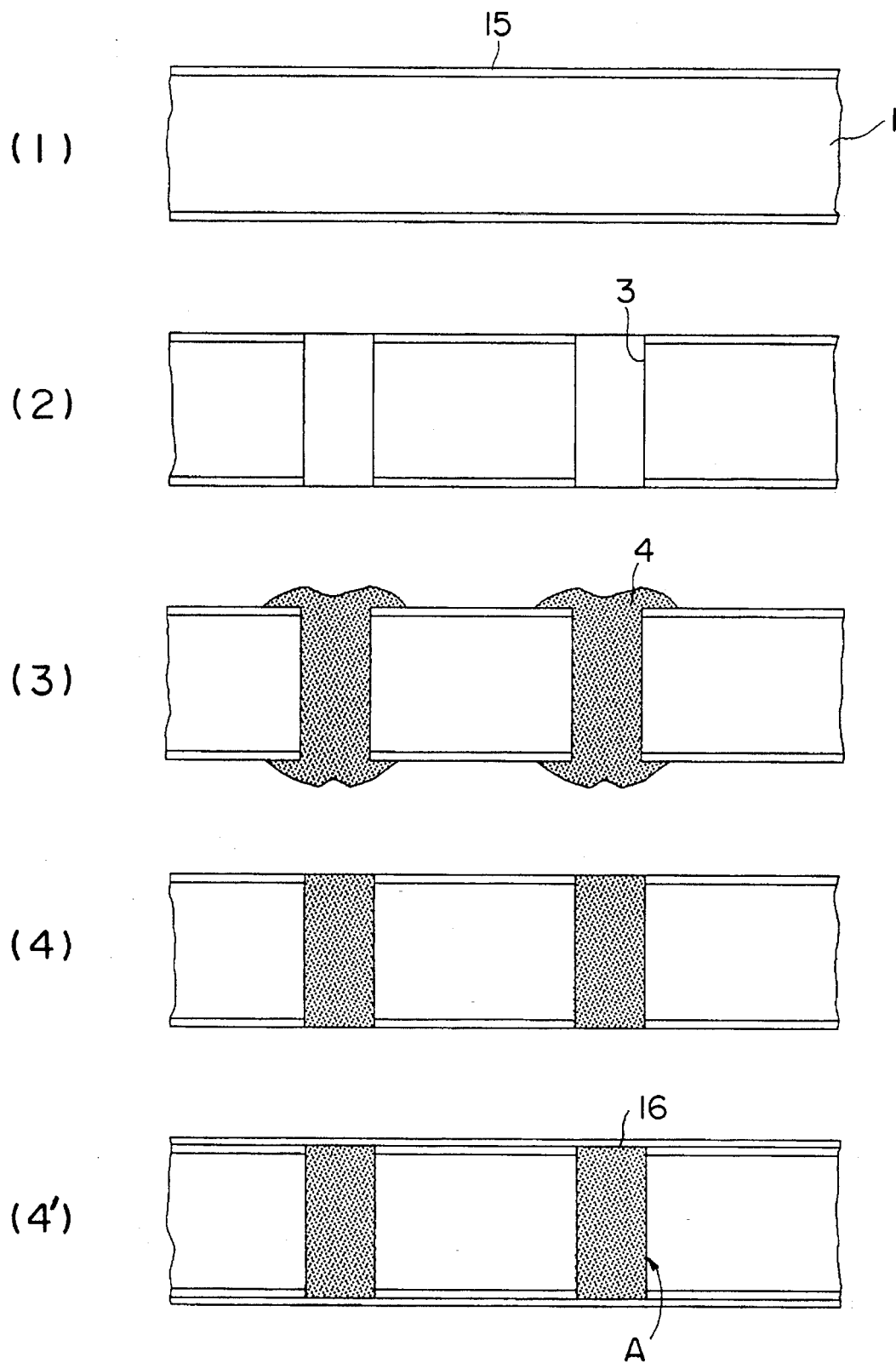
FIG. 8 is a series of cross sectional views showing the fabrication procedure of a double-sided board used in the fabrication procedure shown in FIG. 6.
Figure 8:
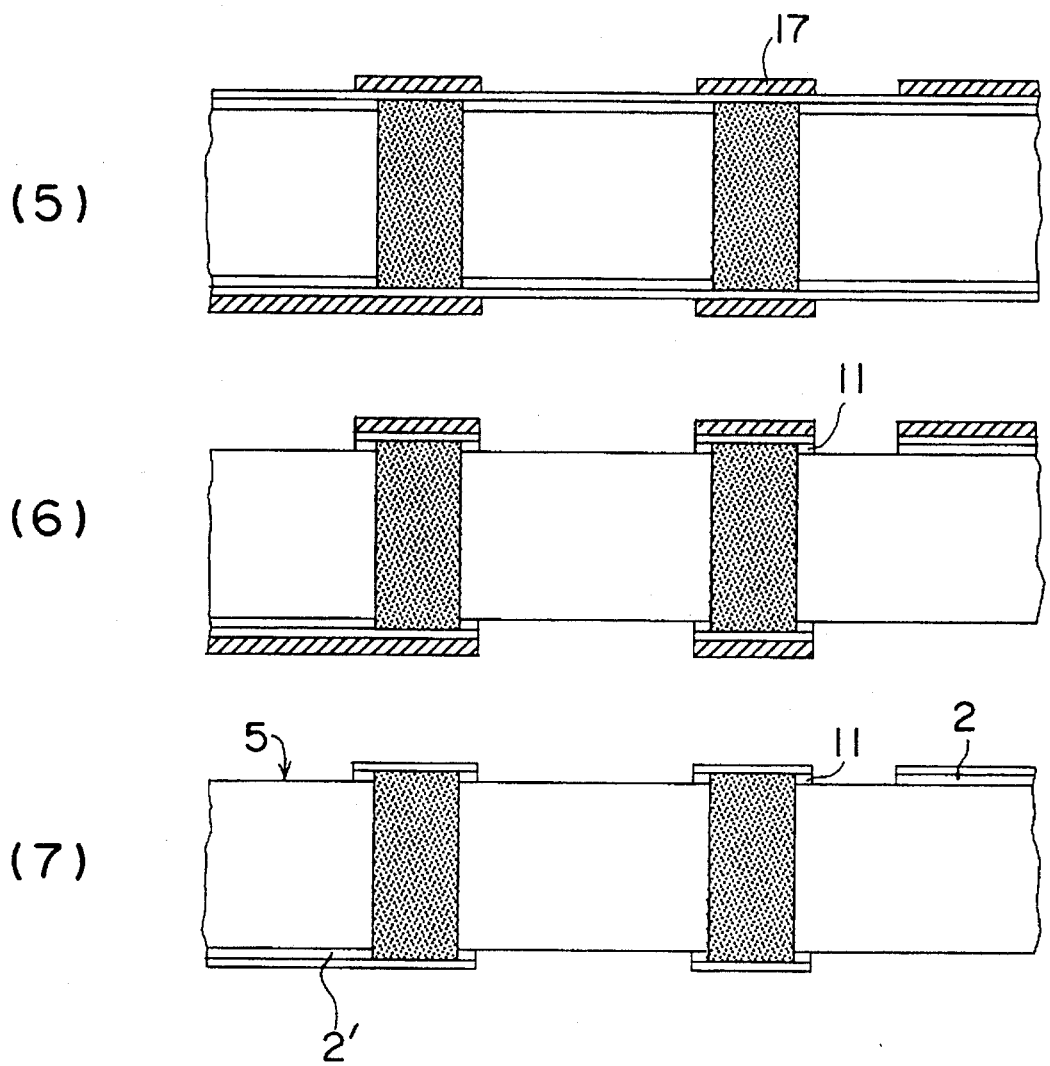
Figure 9:
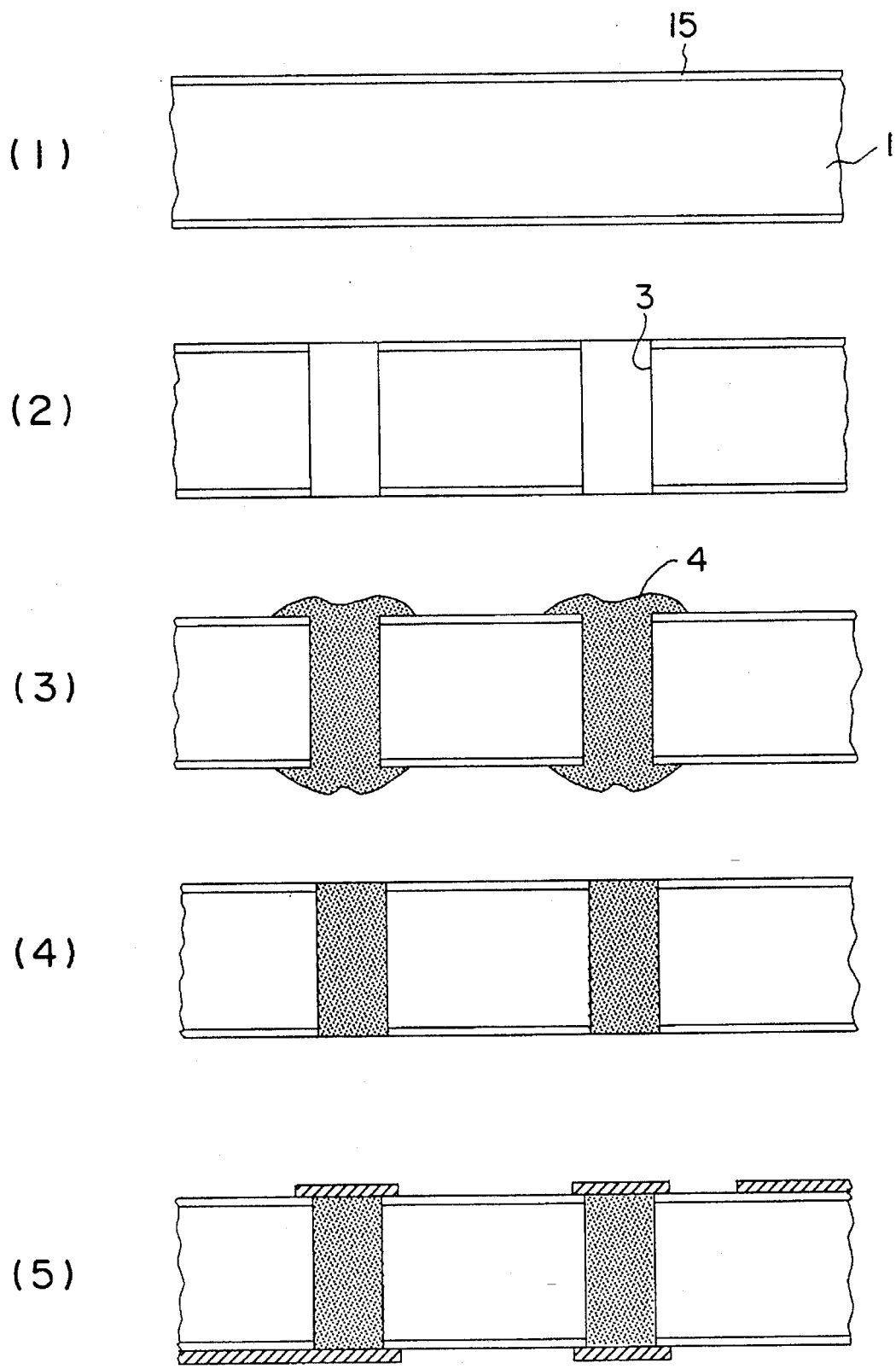
FIG. 9 is a series of cross sectional views showing the fabrication procedure of a double-sided board used in the fabrication procedure shown in FIG. 7.
Figure 9:
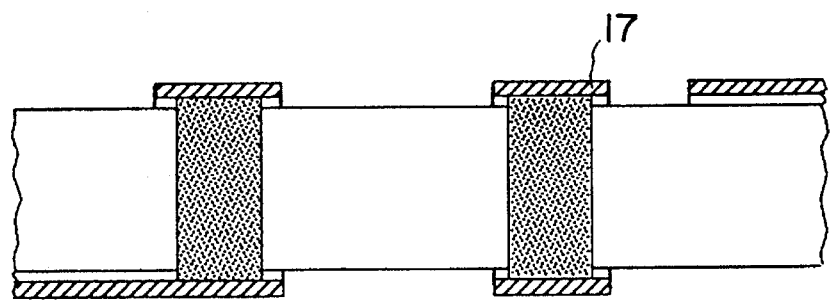
Figure 9:
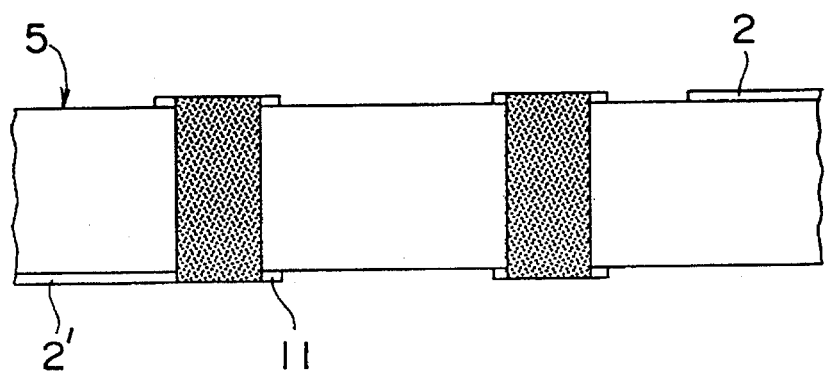

That is, FIG. 8 shows the embodiment in which the hole 3 for the via hole portion is provided in the base material 1 having on each side thereof a conductive layer 15, curable conductive substance which gives rise to the cured material 4 having conductivity is filled in the hole and cured in such a manner that after curing the cured material projects out of the hole, and the surfaces of the conductive layer and the cured material are scrubbed smooth so that the surfaces of the conductive layer and the cured material are substantially flush with each other to form the via hole portion A between the aforementioned conductive layers, and then the plating layer 16 is provided on the smoothed surface, followed by etching predetermined places of the conductive layers composed of the conductive layer and the plating layer to form the first layer wiring patterns 2,2'. On the other hand, FIG. 9 shows the embodiment in which the base material 1 having on each surface thereof the conductive layer 15 is provided with the hole 3 for the via hole portion, a curable conductive substance which gives rise to the cured material 4 having conductivity is filled in the hole and cured in such a manner that after curing the cured material projects out of the hole, and the surfaces of the conductive layer and the cured material are scrubbed smooth so that the surfaces of the conductive layer and the cured material are substantially flush with each other to form the via hole portion A between the aforementioned conductive layers, and then predetermined places of the conductive layer are etched to form the first layer wiring b patterns 2,2'.

Hereinafter, the aforementioned procedures will be described in more detail.

The base material provided with a conductive layer on each surface thereof is formed with the hole 3 for forming a via hole portion. The diameter of the hole may be selected properly so as to correspond to the diameter of the objective via hole portion. As the method of forming the hole 3, there can be used any known means for fabricating ordinary boards such as drilling, punching, laser processing, etc. without particular limitation. In this case, in order to increase the reliability of electrical connection between the cured material of a curable conductive substance filled in the hole 3 and the conductive layer, an inclined surface is provided on the conductive layer positioned around a peripheral portion of the hole so that the contact area with the cured material can increase. There is no limitation on the method of forming an inclined surface on at least a portion of the hole surrounding the conductive layer, and there can be used a method in which after a base material having a conductive layer on each surface thereof is formed with a hole for a via hole portion, mild etching is performed with a mild etchant to form the desired inclined surface, a method in which after the hole is formed, the conductive layer and the insulating layer are tapered by scrubbing using a drill having a diameter slightly larger than that of the hole, a method in which etching is performed with an etching resist having a diameter slightly larger than that of the hole formed around the hole, and so on.

It is preferred that the conductive filling material present in the via hole portion A of the double-sided board is formed by filling the curable conductive substance in the hole 3 in the base material and curing it.

To fill the curable conductive substance in the hole, it is recommended that the curable conductive substance is filled so that it occupies all the space of the hole and protrudes slightly out of both surfaces thereof, specifically by 0.05 mm or more, preferably 0.1 to 2 mm. As representative method for filling the curable conductive substance, there can be used advantageous various means such as a method in which one or more coatings are performed by printing, a method in which the substance is pressed in using a pair of squeegees on both surfaces of the base material, a method in which the substance is filled by a roll coater or a curtain coater, and excessive coating composition is removed using a squeegees, and so on.

Curing method for the curable conductive substance filled in the hole may be selected properly from known curing methods that are suitable for curing of the curable conductive substance, such as curing oven, infrared oven, far infrared oven, UV curing oven, electron beam oven, etc.

It is important that after curing the curable conductive substance, the surface of the conductive layer and the surface of the cured material of the curable conductive substance are scrubbed so that both surfaces are substantially flush with each other. That is, such scrubbing enables pattern formation using an etching resist and etching with high precision in the subsequent wiring pattern formation, and also enables formation of an insulating layer on the wiring pattern with high reliability.

As the method of scrubbing the surfaces of the conductive layer and the cured material of the curable conductive substance smooth as described above, there can be used generally conventional methods such as slurry scrubbing, buff scrubbing, etc.

FIG. 8 shows the embodiment in which the plating layer 16 is formed on the smoothed surface of the conductive layer 15 containing the via hole portion A. By forming such a plating layer and etching it to leave the conductive layer so that the land portion 11 is formed around the periphery of the via hole portion, the via hole portion and the land portion of the wiring pattern can be coated with a common plating layer. Formation of the common plating layer increases the reliability of electrical connection by the via hole portion. Of course, the coating of the via hole portion and the land portion of the wiring pattern by the plating layer may be performed through an insulating layer at the time of laminating the second layer wiring pattern.

The method of forming the plating layer 16 may be either by an electroless plating process or an electroplating process. As the material of the plating layer, while any conventional conductive metal may be used without limitation, generally it is preferred to select the same material as the conductive metal, such as copper, used as the curable conductive substance which gives conductive cured material. The thickness of the plating layer is not limited particularly, and it may be on the order of usually 50 µm, preferably 5 to 35 µm.

As described above, the first layer wiring pattern is formed on the via hole portion, the conductive layer or the smoothed surfaces of conductive layer and the plating layer as shown in the steps shown in FIG. 8 and FIG. 9.

That is, the first layer wiring pattern is formed generally by forming an etching pattern using an etching resist 17 and subsequently performing etching. The etching resist used here is not limited particularly, and photosensitive dry film, liquid resist, etc. may be used that may be selected properly depending on the fineness of the pattern. The etching pattern may be selected properly from positive pattern and negative pattern depending on the type of the etching process. For example, positive patterns are used in the etching process represented by tenting, and negative patterns are used in a pattern plating method, and an SES method.

Figure 10:
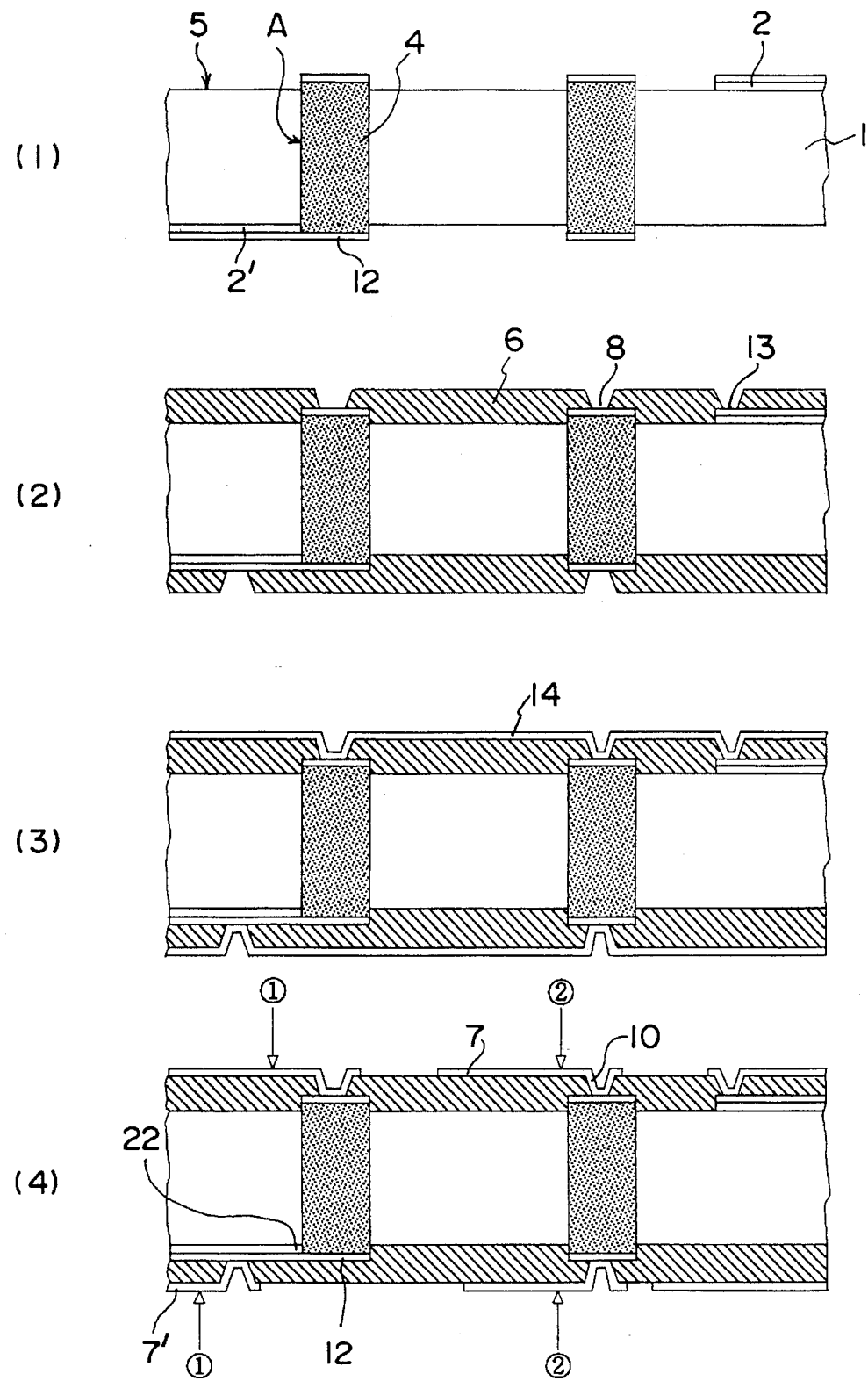
FIG. 10 is a series of cross sectional views showing another example of the fabrication of the multilayer board of this invention.
Figure 11:
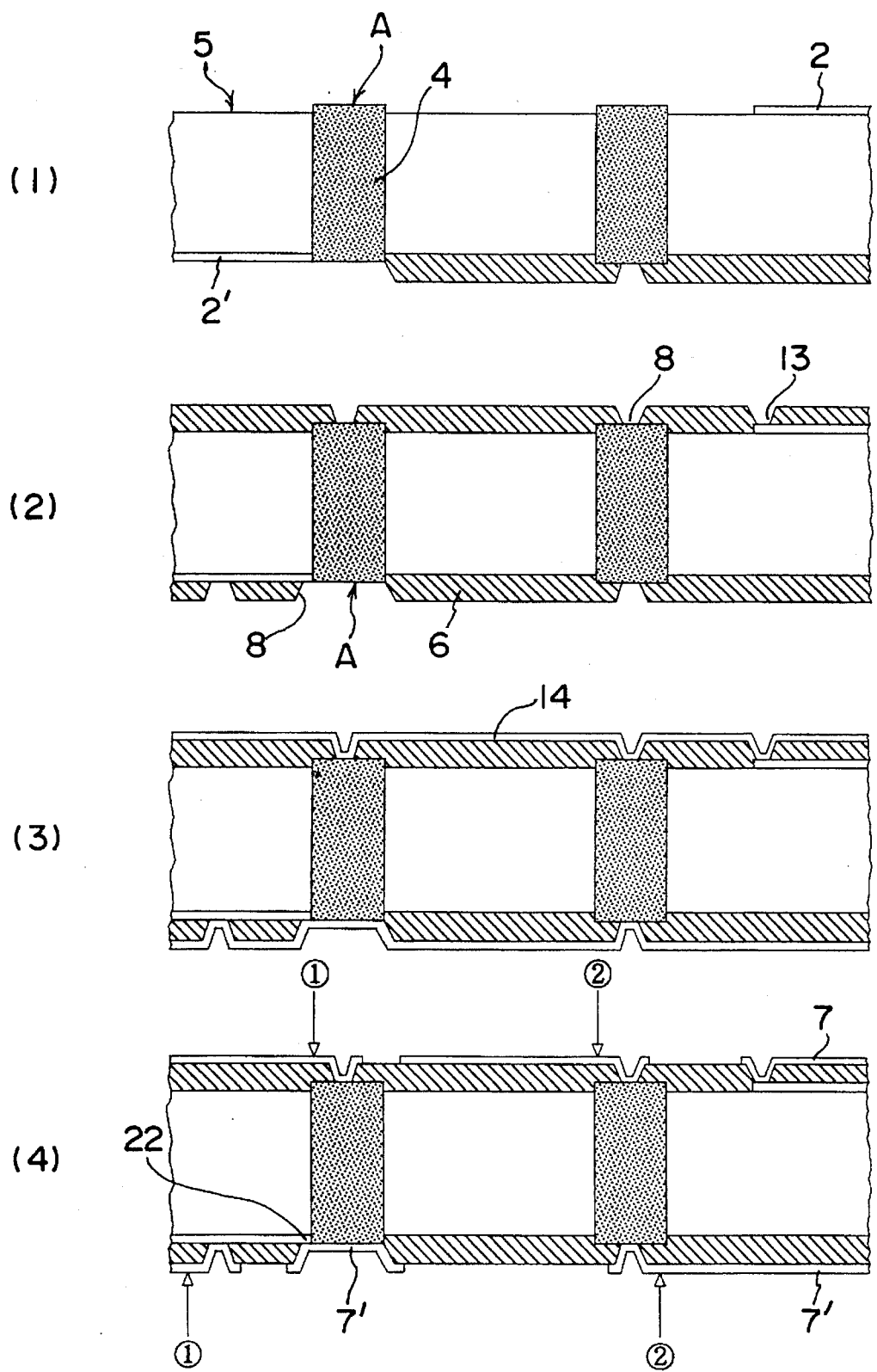
FIG. 11 is a series of cross sectional views showing another example of the fabrication of the multilayer board of this invention.

The above-explained production process relates to the method to produce a multilayer board a wherein a land portion is formed on the periphery of the via hole portion. However, the multilayer board of this invention includes also a mode wherein such a land portion is not formed. FIG. 10 and 11 each show a flow sheet to produce a multilayer board without forming a land portion 11 in the production process exhibited by FIG. 6 and 7.

In FIG. 10, the end surface of the via hole portion A and the connecting terminal portion 22 of said first layer wiring pattern are coated with common plating layer 12 so that the connection between said via hole portion A and the first layer wiring pattern may be established more surely.

In FIG. 11, the end surface of the via hole portion A and the surface of the connecting terminal portion 22 of said first layer wiring pattern are exposed by means of forming an opening 8 in the insulating layer 6, and said exposed portion and the inner wall of the opening are coated with the plating layer 7' which forms the second layer wiring pattern, so that the connection between said via hole portion A and the first layer wiring pattern may be established more surely.

As will be understood from the above, according to the present invention, a double-sided board having a smoothed surface, fabricated by forming a first layer wiring pattern on both sides of a base material, and filling a conductive material in a hole penetrating through the base material to form a via hole portion, is used in the formation of an insulating layer and a second layer wiring pattern on the double-sided board, and this enables formation of the laminated second layer wiring pattern with a high precision. Formation of an insulating layer on both sides of the double-sided board, and subsequent formation of a plating layer thereon are used in the formation of wiring pattern and establishing electrical connection between the wiring patterns, or between the wiring pattern and the via hole portion. This enables formation of wiring patterns with high degree of freedom without separately providing via hole portions penetrating all the layers, which makes it possible to increase circuit density.

Such connection can be achieved with good reliability by means of coating said via hole portion A and the surface of the connecting terminal portion of said first layer wiring pattern (including a mode to form a land portion) with a common plating layer.

Further, in the fabrication procedure, wiring patterns can be laminated on both surfaces of the double-sided board, which enables formation of insulating layers, formation of plating layers, and processing of wiring patterns from the plating layers to be performed simultaneously, making the fabrication procedure more efficient.

Furthermore, since wiring patterns are formed on both surfaces of the double-sided board, electronic components can be mounted on both surfaces thereof.

Hereinafter, the invention will be described concretely by examples. However, the invention should not be construed as being limited thereto.

EXAMPLE 1

A double-sided board was fabricated by the procedure as shown in FIG. 8, and a multilayer board was fabricated using the double-sided board by the procedure as shown in FIG. 6.

More specifically, as shown in FIG. 8, (1) an epoxy glass copper clad laminate 1.6 mm thick was used as the base material 1 having the conductive layer 15 on each surface thereof, and (2) the hole 3 having a diameter of 0.4 mm was provided in the laminate by drilling. (3) In the hole 3 was filled commercially available thermosetting silver paint (PS-652 (trade name), produced by TOKURIKI KAKEN CO., LTD.) as the conductive substance 4 by screen printing so that its cured material slightly protruded out of the hole 3. The silver paint was dried and cured in a curing oven under the conditions of 80° C. for 4 hours, and 150° C. for 2 hours to form the cured material 4 having a conductivity. (4) Then, using No. 320 buff and No. 600 buff serially, the protruding surfaces of the cured material, i.e., cured silver paint was fuffed to smooth the surface of the conductive layer including the cured material. Next, (4') the smoothed surface of the conductive layer including the via hole portion A was subjected to copper electroplating. As the electroplating bath was used CUPRACID GS (trade name, produced by NIHON SHERING K.K.), and electroplating was carried out at a current density of 2 A/dm$^2$ to form the copper plating layer 16 which was 10 µm thick.

Next, (5) on the smoothed surface of the conductive layer, a photosensitive dry film (AQUAMER CF, 1.5 mil, produced by HERCULES) was laminated as the etching resist 17, and exposed to light, and developed to form a resist pattern. Thereafter, (6) etching was carried out with ferric chloride etchant, and (7) the etching resist was stripped. Thus, the double-sided board 5 having the first layer wiring patterns 2,2' with the land portions 11 on both surfaces thereof was obtained.

Next, as shown in FIG. 6, (1) using the double-sided board 5, (2) in order to form an insulating layer on the first layer wiring pattern including the via hole portion A, a photosensitive insulating resist (PROBICOTE 5000: trade name, produced by NIPPON PAINT) was coated and dried, exposed to light, and developed, followed by thermal curing, to form a pattern provided with openings 8 in the insulating layer 6 at predetermined places where electrical connection was needed. Next, (3) after the surface of the insulating layer was roughened, both surfaces were subjected to electroless copper plating and electroplating to form the copper plating layer 14. Then, (4) on the surface of the copper plating layer 14, the etching resist 17 used in (5) above was laminated, which was exposed and developed to form a resist pattern, followed by etching using ferric chloride etching solution, and the etching resist was stripped to form the wiring patterns 7,7'. Thus a multilayer board having 4 layers of wiring patterns was obtained.

The resistance between the wiring patterns 7, 7' (i.e., between ②—② in FIG. 6) which were positioned on both surfaces of the multilayer board thus obtained and which were electrically connected through a common via hole was found to be 31 mΩ. In a thermal shock test according to JIS C-5012 (–65° C.×30 minutes⇌125° C.×30 minutes), the resistance was measured each between ①—① and ②—② in FIG. 6. It was found that, at a cycle exceeding 500 times, there was conductance between said patterns, and, thereafter, almost no increase in the electrical resistance was observed.

EXAMPLE 2

A double-sided board was fabricated by the procedure as shown in FIG. 9, and a multilayer board was fabricated using the double-sided board by the procedure as shown in FIG. 7.

More specifically, as shown in FIG. 9, (1) an epoxy glass copper clad laminate 1.6 mm thick was used as the base material 1 having the conductive layer 15 on each surface thereof, and (2) the hole 3 having a diameter of 0.4 mm was provided in the laminate by drilling. (3) In the hole 3 was filled commercially available thermosetting silver paint (PS-652 (trade name), produced by TOKURIKI KAKEN CO., LTD.) as the conductive substance 4 by screen printing so that its cured material slightly protruded out of the hole 3. The silver paint was dried and cured in a curing oven under the conditions of 80° C. for 4 hours, and 150° C. for 2 hours to form the cured material 4 having a conductivity. (4) Then, using No. 320 buff and No. 600 buff serially, the protruding surfaces of the cured material, i.e., cured silver paint was fuffed to smooth the surface of the conductive layer including the cured material.

Next, (5) on the smoothed surface of the conductive layer, a photosensitive dry film (AQUAMER CF, 1.5 mil, produced by HERCULES) was laminated as the etching resist 17, and exposed to light, and developed to form a resist pattern. Thereafter, (6) etching was carried out with ferric chloride etchant, and (7) the etching resist was stripped. Thus, the double-sided board 5 having the first layer wiring patterns 2,2' with the land portions 11 on both surfaces thereof was obtained.

Next, as shown in FIG. 7, (1) using the double-sided board 5, (2) in order to form an insulating layer on the first layer wiring pattern including the via hole portion A, a photosensitive insulating resist (PROBICOTE 5000: trade name, produced by NIPPON PAINT) was coated, dried, exposed to light, and developed, followed by thermal curing, to form a pattern provided with openings 8 in the insulating 6 at predetermined places where electrical connection was needed. In this example, the insulating layer 6 was formed so that the via hole portion A and the land portion 11 therearound are exposed at a place where the via hole portion and the first layer wiring pattern 2' contact with each other (cf. the lower part of the via hole A in FIG. 7).

Next, (3) after the surface of the insulating layer was roughened, both surfaces of the board were subjected to electroless copper plating and electroplating to form the copper plating layer 14 which was 10 μm thick. Then, (4) on the surface of the copper plating layer 14, the etching resist 17 used in (5) above was laminated, which was exposed and developed to form a resist pattern, followed by etching using a ferric chloride etching solution, and the etching resist was stripped to form the wiring patterns 7,7'. Thus a multilayer board having 4 layers of wiring patterns was obtained.

The resistance between the wiring patterns 7, 7' (i.e., between ②—② in FIG. 7) which were positioned on both surfaces of the multilayer board thus obtained and which were electrically connected through a common via hole was found to be 33 mΩ. In a thermal shock test according to JIS C-5012 (–65° C.×30 minutes⇌125° C.×30 minutes), the resistance was measured each between ①—① and ②—② in FIG. 6. It was found that, at a cycle exceeding 500 times, there was conductance between said patterns, and, thereafter, almost no increase in the electrical resistance was observed.

EXAMPLE 3

A curable conductive substance composed of copper paint was prepared by the following method. That is, linolic acid was blended with dendrite copper powder having an average particle diameter of 6.8 μm, a tap density of 2.99 g/cm$^3$, and a specific surface area of 4,200 cm$^2$ in a proportion of 0.25×10$^5$ mmol/cm$^2$ of copper powder surface, and the mixture was preliminarily mixed in a mortar for 15 minutes in a nitrogen atmosphere. The copper powder thus pretreated (456 parts by weight) was added to 100 parts by weight of a binder composed of neopentyl glycol glycidyl ether (epoxy equivalent=150)/novolak type phenol resin (hydroxyl equivalent=105)=74/26 (weight ratio), and further 2.8 parts by weight of 2-ethyl-4-methylimidazole per 100 parts by weight of binder was added thereto. Thereafter, the mixture was kneaded for 30 minutes using a three-roll mill to form a paint.

In the method of Example 1, fabrication of a multilayer board was performed in the same manner as described above except that the aforementioned copper paint was used in place of the silver paint.

The resistance between the wiring patterns 7, 7' (i.e., between ②—② in FIG. 6) which were positioned on both surfaces of the multilayer board thus obtained and which were electrically connected through a common via hole was found to be 39 mΩ. In a thermal shock test according to JIS C-5012 (65° C.×30 minutes⇌125° C.×30 minutes), the resistance was measured each between ①—① and ②—② in FIG. 6. It was found that, at a cycle exceeding 500 times, there was conductance between said patterns, and, thereafter, almost no increase in the electrical resistance was observed.

EXAMPLE 4

A double-sided board having such a configuration as shown in FIG. 10(1) was produced by the same manner as mentioned in FIG. 8 and shown in Example 1 except that no land portion was formed on the periphery of the via hole portion.

Next, there was produced a multilayer board as shown in FIG. 10(4), which had no land portion formed on the periphery of the via hole portion, by putting the process of FIG. 10 into practice in accordance with the method shown in FIG. 6 and Example 1.

The resistance between the wiring patterns 7, 7' which were positioned on both surfaces of the multilayer board thus obtained and which were electrically connected through a common via hole was measured. It was found that, in FIG. 10, the resistance between ①—① was 29 mΩ, and that the one between ②—② was also 29 mΩ. In a thermal shock test according to JIS C-5012 (−65° C.×30 minutes⇔125° C.×30 minutes), the resistance was measured each between ①—① and ②—② in FIG. 6. It was found that, at a cycle exceeding 500 times, there was conductance between said patterns, and, thereafter, almost no increase in the electric resistance was observed.

What is claimed is:

1. A multilayer board comprising:
    a smooth-surfaced double-sided board having:
        a base material provided with a hole penetrating therethrough,
        a first layer wiring pattern provided on both surfaces of said base material and having a surface, and
        conductive material filled in said hole, said filler having ends being substantially flush with said surface of said first layer wiring pattern, thus forming a via hole portion having ends;
    an insulating layer provided on at least one surface of said double-sided board, said insulating layer being formed with an opening having an inner wall; and
    a second layer wiring pattern comprising a plating layer provided on said double-sided board through said insulating layer;
    wherein at least a portion of one of said ends of said via hole portion is exposed in said opening, and wherein said inner wall of said opening and exposed portion of said end of said via hole portion are coated with a plating layer connecting to said plating layer of said second layer wiring pattern, thus establishing electrical connection between said second wiring pattern and said via hole portion; and
    said first layer wiring pattern having a connecting terminal portion which electrically connects with the via hole portion, wherein said via hole portion and said connecting terminal portion of the first layer wiring pattern which connects with the via hole portion are coated with a continuous plating layer, thus establishing electrical connection between said first layer wiring pattern and said via hole portion.

2. The multilayer board of claim 1 wherein the plating layer, with which said via hole portion and said connecting terminal portion of the first layer wiring pattern which connects with the via hole portion are coated, is connecting to said plating layer of said second layer wiring pattern.

3. The multilayer board of claim 1 wherein the plating layer, with which said via hole portion and said connecting terminal portion of the first layer wiring pattern which connects with the via hole portion are coated, is another plating layer.

4. The multilayer board of any one of claims 1–3 wherein the connecting terminal portion of said first layer wiring pattern which connects with the via hole portion forms a land portion which connects with the periphery of said via hole portion, and wherein said via hole portion and said land portion which constitutes the connecting terminal portion of the first layer wiring pattern are coated with a continuous plating layer, thus establishing electrical connection between said first layer wiring pattern and said via hole portion.

5. The multilayer board of claim 1, wherein said insulating layer has another opening having an inner wall, and said first layer wiring pattern has a terminal portion at least a portion of which is exposed in said another opening, and wherein said inner wall of said another opening and said exposed terminal portion of said first layer wiring pattern are coated with said plating layer connecting to said plating layer of said second layer wiring pattern, thus establishing electrical connection between said second layer wiring pattern and said first layer wiring pattern.

6. The multilayer board of any one of claims 1–3, further comprising at least a third layer wiring pattern on said second layer wiring pattern through a second insulating layer.

7. The multilayer board of claim 4, further comprising at least a third layer wiring pattern on said second layer wiring pattern through a second insulating layer.

8. The multilayer board of claim 5, further comprising at least a third layer wiring pattern on said second layer wiring pattern through a second insulating layer.

* * * * *